United States Patent
Landt et al.

(10) Patent No.: US 8,384,577 B1
(45) Date of Patent: Feb. 26, 2013

(54) VOLTAGE-MODE, SERIES-CONNECTED, SEGMENTED, OPTICALLY-ISOLATED, POWER DIGITAL-TO-ANALOG CONVERTER

(75) Inventors: Don L. Landt, Palo, IA (US); David W. Cripe, Mount Vernon, IA (US); Scott L. Patten, Marion, IA (US); Forest P. Dixon, Cedar Rapids, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 133 days.

(21) Appl. No.: 13/096,345

(22) Filed: Apr. 28, 2011

(51) Int. Cl.
*H03M 1/66* (2006.01)

(52) U.S. Cl. .................................. 341/145; 341/144

(58) Field of Classification Search .............. 341/144, 341/145, 118
See application file for complete search history.

(56) References Cited

U.S. PATENT DOCUMENTS

| | | | |
|---|---|---|---|
| 6,232,904 B1 * | 5/2001 | Hartmann et al. | 341/145 |
| 6,317,067 B1 * | 11/2001 | Mohindra | 341/145 |
| 6,512,471 B2 * | 1/2003 | Marten | 341/144 |
| 6,549,155 B1 * | 4/2003 | Heminger et al. | 341/144 |

* cited by examiner

*Primary Examiner* — Jean B Jeanglaude
(74) *Attorney, Agent, or Firm* — Donna P. Suchy; Daniel M. Barbieri (57) ABSTRACT

A power digital to analog converter may include a course-resolution digital to analog converter for converting a first segment of binary digits into a first analog output having a first voltage. The power digital to analog converter may also include a fine-resolution digital to analog converter connected in series with the course-resolution digital to analog converter. The fine-resolution digital to analog converter may be configured for converting a second segment of binary digits into a second analog output having a second voltage. The first voltage and the second voltage may be added together to produce an analog output signal representing the binary digits.

20 Claims, 6 Drawing Sheets

VOLTAGE-MODE, SERIES-CONNECTED, SEGMENTED, OPTICALLY-ISOLATED, POWER DIGITAL-TO-ANALOG CONVERTER

CROSS-REFERENCE TO RELATED APPLICATIONS

The following United States Patent Applications are incorporated by reference in their entireties:

| Attorney Docket No. | Filing Date | Serial No. |
| --- | --- | --- |
| 06CR103 | Jan. 22, 2007 | 11/656,241 |
| 11CR152 | Mar. 26, 2011 | 13/093,894 |

TECHNICAL FIELD

The present disclosure generally relates to the field of power amplification for signals, and more particularly to an apparatus, system, and method for converting multiple digital signals to an amplified analog output signal.

BACKGROUND

As new military and commercial systems are developed, there is an ever increasing demand for signal sources having unprecedented combinations of output power, efficiency, and transmit bandwidth, with ever decreasing size and weight, as well as extreme linearity requirements. These combined factors have led to an evolution of output signal sources from conventional high power amplifiers to high Power Digital to Analog Converters (PDACs). For instance, communication and navigation systems may demand Radio Frequency (RF), micro- and millimeter-wave Power Amplifiers (PAs), which are similar in operation to high performance Digital-to-Analog Converters (DACs), and which are capable of producing high power over wide frequency ranges with high DC-to-RF efficiency, linear amplitude control over several decades, and with minimum size and/or weight. Many of these systems must also generate linear waveforms with tight spectral control and supply complete digital control of PA and DAC functions for software controlled applications. Currently employed linearization techniques like predistortion, feedforward, and envelope restoration are limited in bandwidth, temperature range, and efficiency.

Achieving high powers has required DAC designers to use high speed devices, such as Bipolar Transistors, High Electron Mobility Transistors (HEMTs), Insulated Gate Bipolar Transistors (IGBTs), or Metal-Oxide-Semiconductor Field-Effect Transistors (MOSFETs) in large sizes (i.e., in terms of total gate width or emitter area) to obtain the specified power levels. However, as the high speed device's size increases, a limit may be reached in how large a device can be electrically, how low its terminal impedances can be, and the ability of matching circuits to reach the extremely low impedances on the input and output of the device. Thus, matching to large devices may require large transformation ratios, which are inherently frequency band limited.

Generally, the primary function of a DAC is to convert a low power digital signal to an equivalent analog signal in a fast, efficient, and precise manner. Different architectures may be utilized to create high-speed, low-distortion DACs. DAC circuit topologies include pulse width modulator, oversampling (delta-sigma), R-2R, binary-weighted resistor, and current-scaled DACs. In a pulse width modulator DAC, for example, a stable current or voltage is switched into a low-pass analog filter. The oversampling technique allows for the use of a lower resolution, typically 1-bit, DAC internally. R-2R DACs have variable source impedance depending upon which resistor ladders are switched into the circuit. Weighted resistor DACs have binary weighted resistors which directly scale the analog output voltage. In both topologies, the output voltage is less than the input voltage.

Many high speed DACs utilize some form of non-saturating current-mode switching. A straight binary DAC with one current switch per bit produces code-dependent glitches and may not be an optimum architecture. A DAC with one current source per code level can be shown not to have code-dependent glitches, but may not be practical to implement for high resolutions. Current-scaled DACs scale binary weighted constant current sources or sinks based on the digital input. All of these examples are implemented on a low power level, where the main concern is the conversion of the signal. If a high-power analog signal is needed, another amplifier stage must be cascaded to provide the needed voltage or current drive. Also most of these examples have either pull up or pull down semiconductor devices, not both, so either the rise or fall time for a voltage transition may be very slow.

Thus, it would be desirable to provide a power amplifier with digital to analog conversion features that yields linear or pseudo-linear operation, while maintaining system efficiency.

SUMMARY

A power digital to analog converter may include a course-resolution digital to analog converter for converting a first segment of binary digits into a first analog output having a first voltage. The power digital to analog converter may also include a fine-resolution digital to analog converter connected in series with the course-resolution digital to analog converter. The fine-resolution digital to analog converter may be configured for converting a second segment of binary digits into a second analog output having a second voltage. The first voltage and the second voltage may be added together to produce an analog output signal representing the binary digits.

A method for converting multiple digital signals to an amplified analog output signal may include connecting a course-resolution digital to analog converter in series with a fine-resolution digital to analog converter. The method may also include converting a first segment of binary digits into a first analog output having a first voltage utilizing the course-resolution digital to analog converter. The method may further include converting a second segment of binary digits into a second analog output having a second voltage utilizing the fine-resolution digital to analog converter. The method may also include summing the first voltage and the second voltage together to produce an analog output signal representing the binary digits.

A system for converting multiple digital signals to an amplified analog output signal may include a step generator for converting a first segment of binary digits into a first analog output having a first voltage. The system may also include an interpolator for converting a second segment of binary digits into a second analog output having a second voltage. The first voltage and the second voltage may be added together to produce an analog output signal representing the binary digits. The system may further include a controller module coupled with the step generator and the interpolator for supplying the first segment of binary digits and the second segment of binary digits. The system may also include a load connected to the step generator and the interpolator for receiving the analog output signal.

It is to be understood that both the foregoing general description and the following detailed description are exemplary and explanatory only and are not necessarily restrictive of the present disclosure. The accompanying drawings, which are incorporated in and constitute a part of the specification, illustrate subject matter of the disclosure. Together, the descriptions and the drawings serve to explain the principles of the disclosure.

BRIEF DESCRIPTION OF THE DRAWINGS

The numerous advantages of the disclosure may be better understood by those skilled in the art by reference to the accompanying figures in which.

DETAILED DESCRIPTION

Reference will now be made in detail to the subject matter disclosed, which is illustrated in the accompanying drawings.

Referring generally to FIGS. 1 through 6, a high Power Digital to Analog Converter (PDAC) 100 is described. The PDAC 100 is designed to receive multiple digital signals and convert them into an analog output signal. In embodiments, the PDAC 100 includes a programmable, Digital to Analog Converter (DAC) that simultaneously provides high-power, efficient Direct Current (DC) to Radio Frequency (RF) conversion, with wide instantaneous bandwidth, high-linearity, and many decades of linear amplitude operation. The PDAC 100 may be implemented utilizing a segmented approach with voltage-mode coarse and fine DACs connected serially with a load utilizing optically coupled signals and power links. Thus, the PDAC 100 may be implemented as a voltage-mode, series-connected, segmented, Optically-isolated Power DAC (OP-DAC). In embodiments, the PDAC 100 may be utilized with, but not limited to, digital PAs for software defined radios, Ultra Wide Band (UWB) radars, PA Traveling Wave Tube (TWT) replacement, Quint Networking Technology (QNT) PA for Ultra High Frequency (UHF)/Very High Frequency (VHF) sockets and L-band Mesh and Ku-band, Ultra-Wideband Low Probability of Intercept (LPI) Radar, remote PA applications, weapon terminal phase target verification systems, Electronic Warfare (EW) jammers, and X-band radar systems.

In embodiments, the PDAC architecture includes a number of nonlinear highly efficient optically driven switches and amplifier sections that are selectively stacked to achieve a desired output power. A programmable algorithm may be utilized to combine the amplifier sections in a time sequence that yields a piece-wise approximation to a continuous linear waveform. It should be noted that the number of nonlinear amplifier sections utilized may dictate both the precision of the transmitted waveform and the degree of near-carrier spectral control and harmonic control. An extremely high speed optical signal link may be employed to generate a separate drive signal for each nonlinear amplifier section, which may avoid the bandwidth limitations of classical DAC designs, while providing isolated building block amplifiers for any desired combination of elements.

Figure 1:
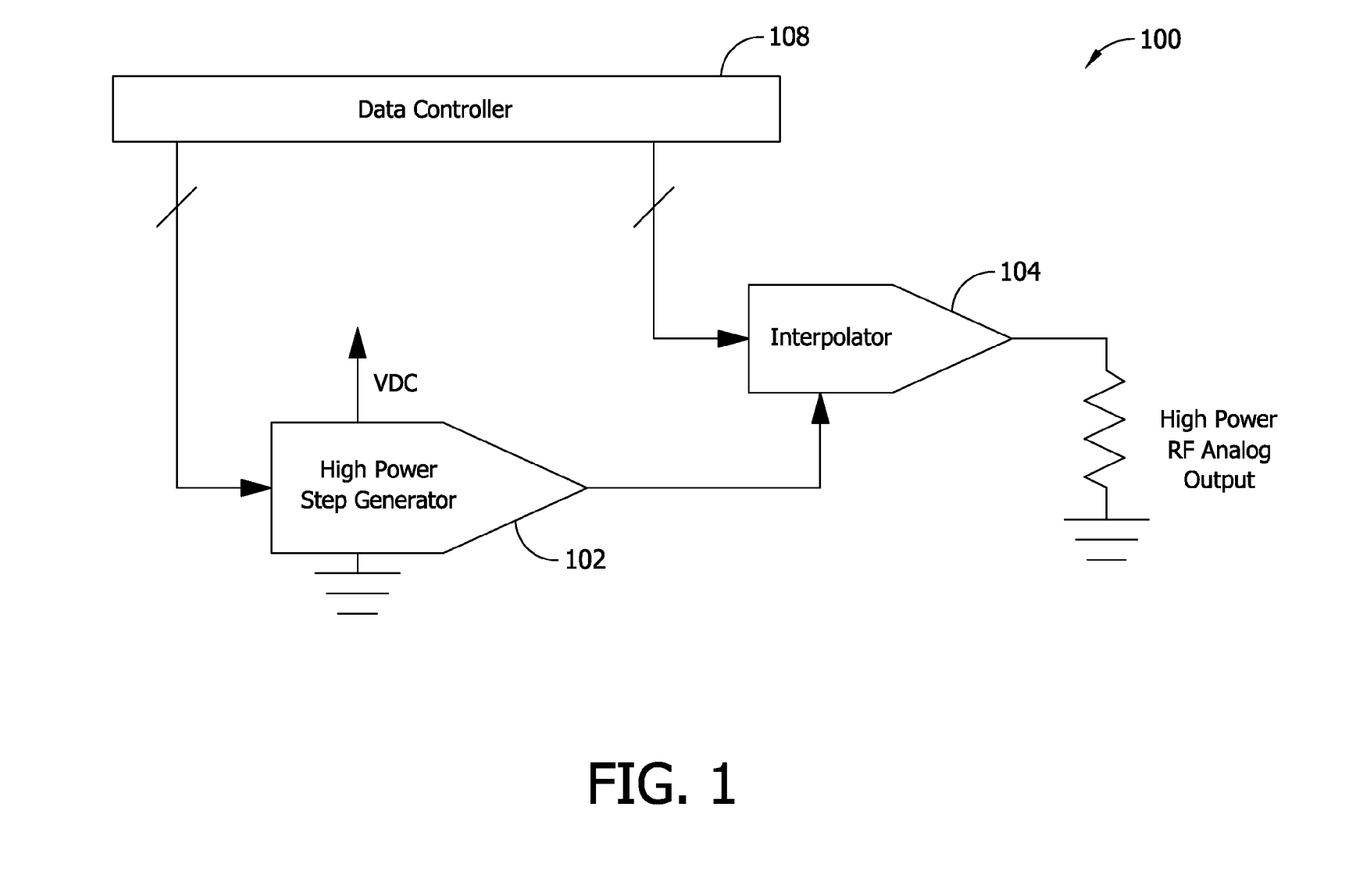
FIG. 1 is a schematic illustrating a Power Digital to Analog Converter (PDAC)
Figure 2:
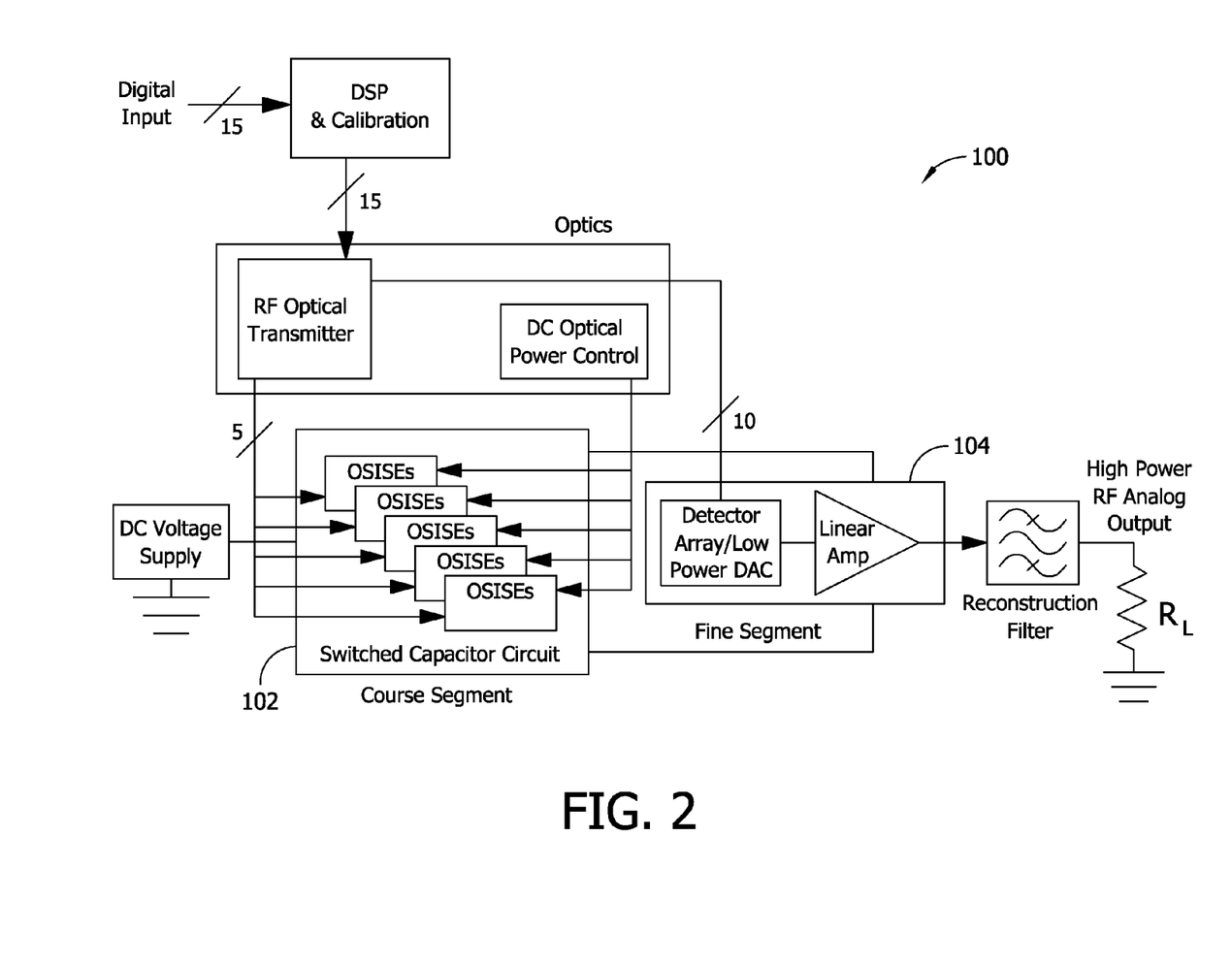
FIG. 2 is a block diagram illustrating a PDAC.

The PDAC 100 includes a high power step generator, such as a course-resolution DAC 102, and an interpolator, such as a fine-resolution DAC 104, connected together in series such that their total output is in series with the load connected to the PDAC 100. In embodiments, the PDAC 100 is realized by splitting a required number of binary digits (bits) into two segments. The bits are then combined in a series, voltage mode topology. For example, the course-resolution DAC 102 may be implemented as a high-voltage, high current, coarse-resolution switched-capacitor DAC. A course-resolution switched-capacitor DAC is described in U.S. patent application Ser. No. 13/093,894, entitled "POWER DIGITAL-ANALOG-CONVERTER WITH SWITCHED CAPACITOR VOLTAGE DIVISION," which is herein incorporated by reference in its entirety. The fine-resolution DAC 104 may be implemented as a low-voltage, fine-resolution, high current DAC and linear amplifier. The course-resolution DAC 102 may be supplied with a first segment of bits for converting into an analog output. The fine-resolution DAC 104 may be supplied with a second segment of bits for converting into an analog output. Then, the voltage output of the course-resolution DAC 102 may be added to the voltage output of the fine-resolution DAC 104 to produce an analog output signal representing the binary digits.

In a specific example, a total Effective Number of Bits (ENOBs) of 13 may be specified for the PDAC 100. In this instance, an actual number of 15 bits may be required for the PDAC 100. The 15 actual bits may be achieved by splitting the bits into a course and fine segmentation, and then supplying the two segments to the course-resolution DAC 102 and the fine-resolution DAC 104, as previously described. For example, five coarse bits may be utilized for the first segment of bits supplied to the course-resolution DAC 102, and ten fine bits may be supplied to the fine-resolution DAC 104. It will be appreciated that this combination of course and fine bits may be utilized to increase the efficiency of the PDAC 100 over efficiencies that would be attainable with either a standalone linear amplifier (e.g., operating Class-A) or a standalone switched-capacitor DAC (e.g., due to the number of switches required and large switching losses).

In an example implementation, the course-resolution DAC 102 and the fine-resolution DAC 104 may be required to operate at a full load current of 1.6 amps. With 100 watts of power, a voltage of 160 volts would be required. Five bits would imply a Least Significant Bit (LSB) of 5 volts for the course-resolution DAC 102. In this implementation, the fine-resolution DAC 104 should have an overlap of approximately 1.2 with respect to the LSB of the course-resolution DAC 102. These parameters may then set the peak-to-peak voltage swing of the fine-resolution DAC 104 to six volts. At a maximum current for the fine-resolution DAC 104 of 1.6 amps peak, the worst case power dissipation in the fine-resolution DAC 104 may be eight watts. It will be appreciated that these characteristic are provided by way of example only, and the PDAC 100 may include other various currents, voltages, powers, and/or LSBs. Further, it will be appreciated that other combinations of bits may be provided to the course-resolution DAC 102 and/or the fine-resolution DAC 104, including a single bit, or any other number of bits.

Nonlinear operation of the power device in the PDAC 100 may be required to yield the highest efficiency, with switched mode operation being a common employed technique. This mode of operation can be employed with square wave drive excitation, fast rise and fall times, and push-pull differential phasing, with minimal dead time between the positive and negative rail drive excitation. In an embodiment, the course-resolution DAC 102 may utilize a structure such as an Optically Sourced Isolated Switching Element (OSISE) structure 106, which is an isolated, optically triggered, optically powered switch that can be combined in series to provide very high output powers and deliver power to a load impedance, typically 50 ohms without the use of matching structures. An OSISE structure is described in U.S. patent application Ser. No. 11/656,241, entitled "MICROWAVE SWITCHING ELEMENT," which is herein incorporated by reference in its entirety. It should be noted that in other implementations, the course-resolution DAC 102 may utilize other transistor types, switches, and/or drive circuitry, including Commercial Off-The-Shelf (COTS) Class D power amplification/power conversion circuitry.

Figure 3:
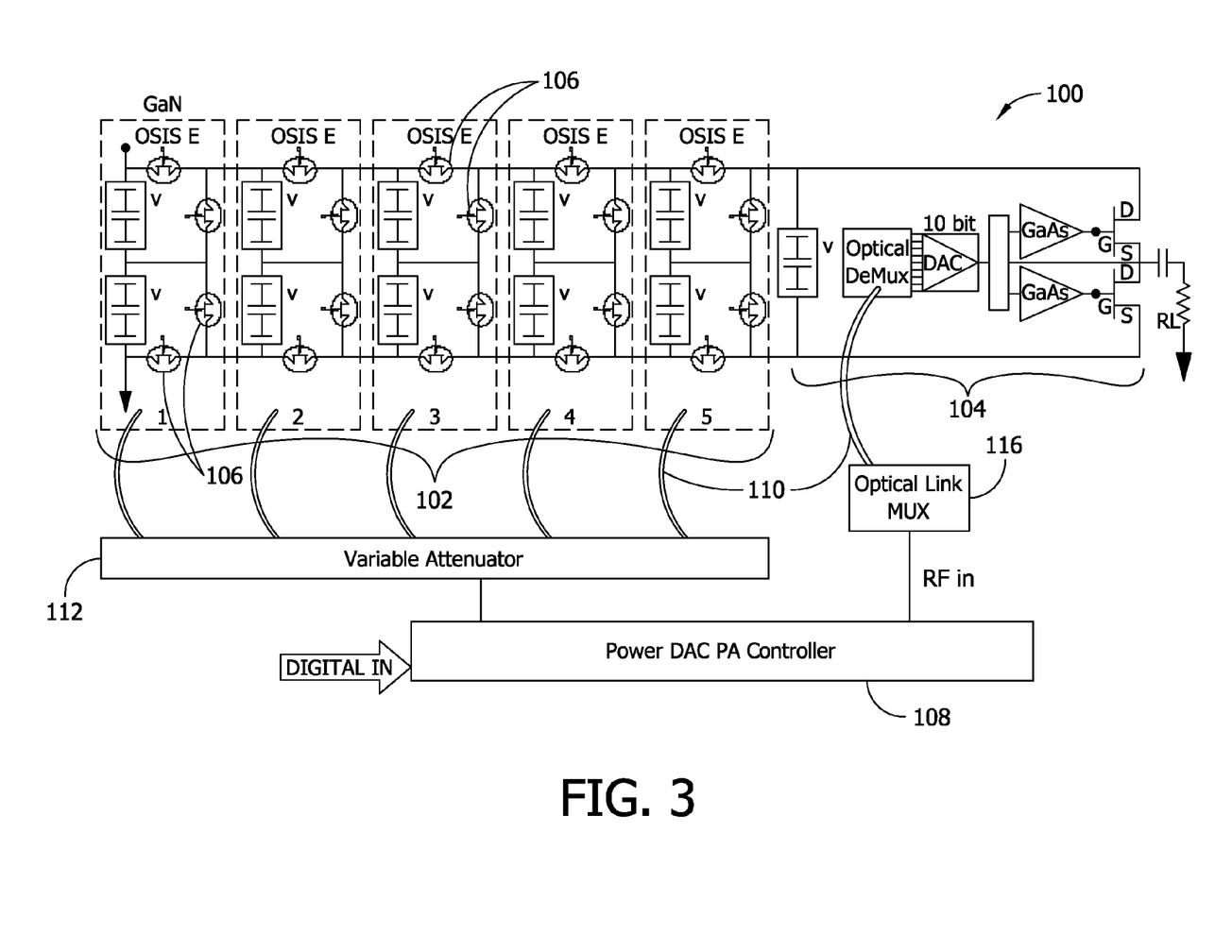
FIG. 3 is a circuit diagram illustrating a PDAC including a non-floating core module with a floating linear amplifier module, where the PDAC is connected to a Radio Frequency (RF) output load RL.
Figure 4:
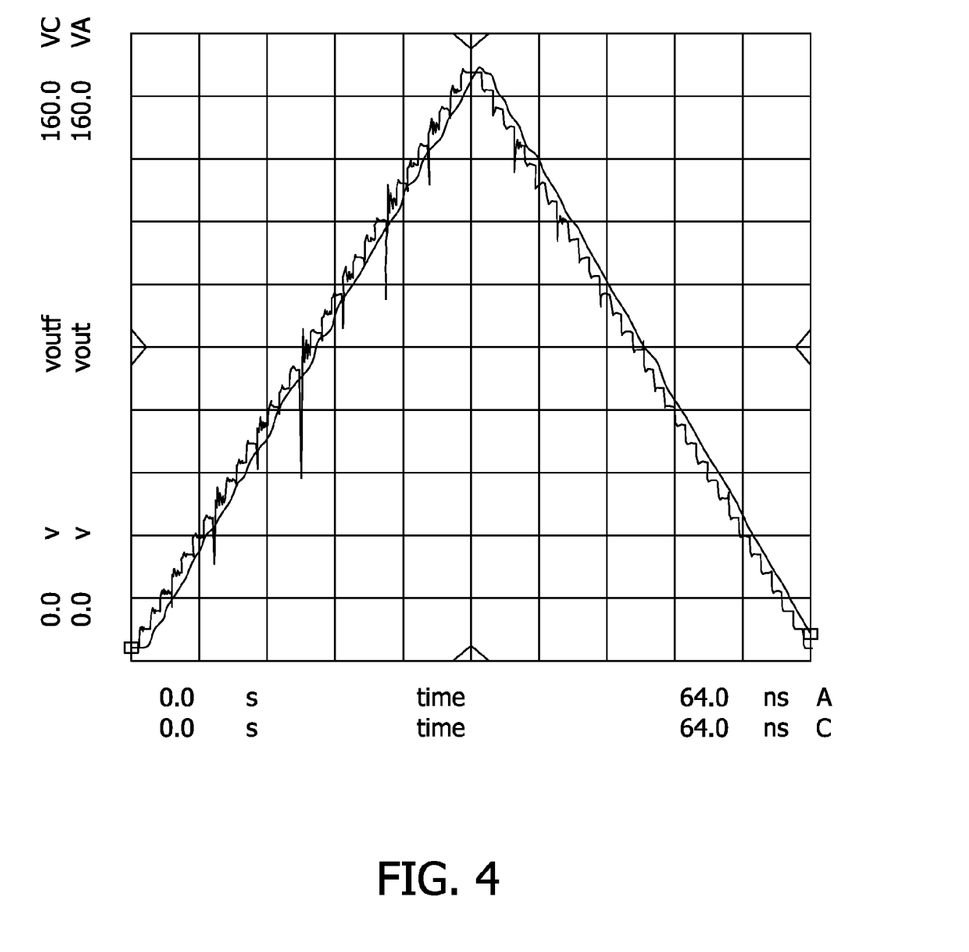
FIG. 4 is a graph illustrating a triangular output waveform as generated by the PDAC described in FIG. 3.
Figure 5:
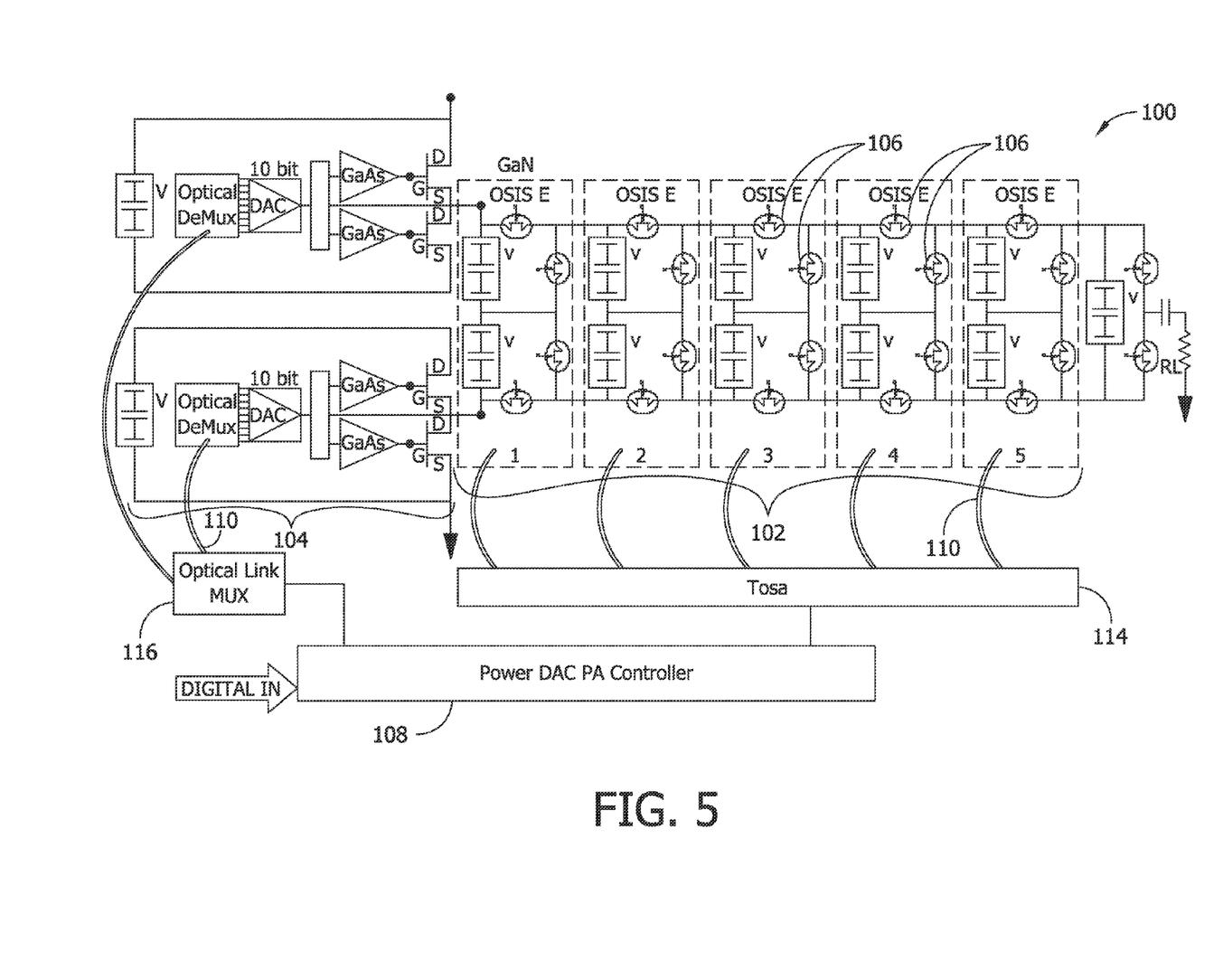
FIG. 5 is a circuit diagram illustrating a PDAC including a non-floating linear amplifier module with a floating core module, where the PDAC is connected to an RF output load RL.

In embodiments, the PDAC 100 may include a controller module, such as a PDAC Power Amplifier (PA) controller 108 coupled with the course-resolution DAC 102 and the fine-resolution DAC 104 for supplying the first segment of bits to the coarse resolution DAC 102 and for supplying the second segment of bits to the fine resolution DAC 104. The PDAC PA controller 108 may be coupled with the course-resolution DAC 102 and the fine-resolution DAC 104 via a number of optical links 110. For example, the PDAC PA controller 108 may be coupled with the course-resolution DAC 102 via a variable attenuator 112 (as illustrated in FIG. 3). Alternatively, the PDAC PA controller 108 may be coupled with the course-resolution DAC 102 via a Transmitter Optical Sub-Assembly (TOSA) 114 (as illustrated in FIG. 5). The variable attenuator 112 and/or the TOSA 114 may be coupled with the course-resolution DAC 102 via optical links 110. Further, the PDAC PA controller 108 may be coupled with the fine-resolution DAC 104 via an optical link multiplexer 116, which may be coupled with the fine-resolution DAC 104 via optical links 110. In embodiments, the fine-resolution DAC 104 may include one or more optical demultiplexers.

Thus, the PDAC 100 may provide a power DAC architecture capable of transmitting both linear and nonlinear waveforms with very high simultaneous output power and efficiency. It will be appreciated that system output power, and the corresponding transmit range, may be controlled by the number of nonlinear elements (switches) activated. For example, in a specific instance, a fourfold size and/or weight reduction may be projected over legacy power amplifier systems. Further, by utilizing the efficiency of the nonlinear amplifier building blocks, twofold and fourfold efficiency improvements are contemplated versus legacy nonlinear and linear amplifiers, respectively.

It should be noted that one terminal of all supplies in the PDAC 100 is connected to ground. In this type of implementation, no floating supplies means that switching can be performed quickly, since the potential of sources to ground remains the same. Also, floating switches are utilized. This may be accomplished with optically coupled, optically powered/sourced switching elements, as previously described. Further, it is contemplated that both P-type and N-Type switches may be implemented with the OSISE architecture. A photonic power converter may be utilized to supply DC power to the OSISE switches, which contain high-speed, internal drive amplifiers, resulting in extremely fast switching times when the DAC is commanded to switch states. Also, output potentials may be driven to power supply voltages through low impedance switches. This may allow for switching speeds having very high values approaching theoretical limits.

Figure 6:
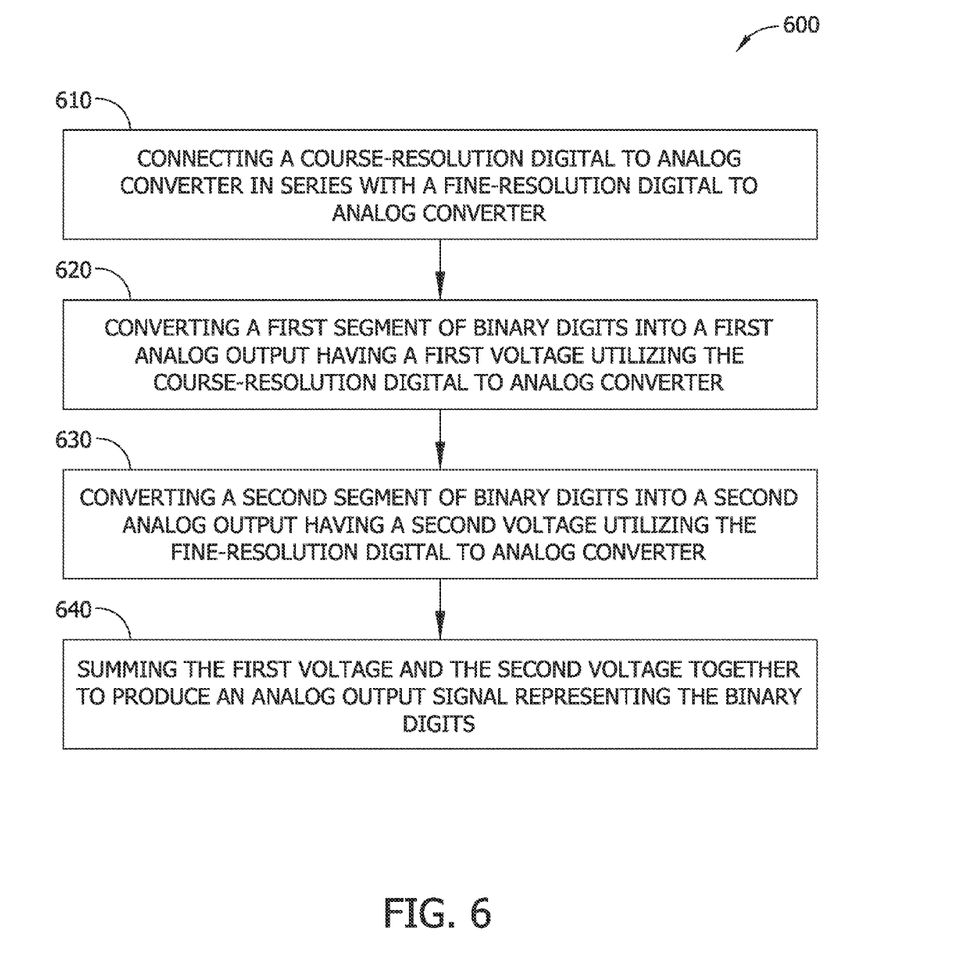
FIG. 6 is a flow diagram illustrating a method for converting multiple digital signals to an amplified analog output signal.

Referring now to FIG. 6, a method 600 for converting multiple digital signals to an amplified analog output signal is described. The method 600 may include connecting a course-resolution digital to analog converter in series with a fine-resolution digital to analog converter, 610 The method 600 may also include converting a first segment of binary digits into a first analog output having a first voltage utilizing the course-resolution digital to analog converter, 620. The method 600 may further include converting a second segment of binary digits into a second analog output having a second voltage utilizing the fine-resolution digital to analog converter, 630. The method 600 may also include summing the first voltage and the second voltage together to produce an analog output signal representing the binary digits, 640.

In the present disclosure, the methods disclosed may be implemented as sets of instructions or software readable by a device. Further, it is understood that the specific order or hierarchy of steps in the methods disclosed are examples of exemplary approaches. Based upon design preferences, it is understood that the specific order or hierarchy of steps in the method can be rearranged while remaining within the disclosed subject matter. The accompanying method claims present elements of the various steps in a sample order, and are not necessarily meant to be limited to the specific order or hierarchy presented.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes.

What is claimed is:

1. A power digital to analog converter, comprising:
    a course-resolution digital to analog converter for converting a first segment of binary digits into a first analog output having a first voltage; and
    a fine-resolution digital to analog converter connected in series with the course-resolution digital to analog converter, the fine-resolution digital to analog converter for converting a second segment of binary digits into a second analog output having a second voltage, where the first voltage and the second voltage are added together to produce an analog output signal representing the binary digits.

2. The power digital to analog converter of claim 1, wherein the course-resolution digital to analog converter comprises a switched-capacitor digital to analog converter.

3. The power digital to analog converter of claim 1, wherein the fine-resolution digital to analog converter comprises a linear amplifier.

4. The power digital to analog converter of claim 1, wherein the first segment of binary digits comprises five binary digits.

5. The power digital to analog converter of claim 1, wherein the second segment of binary digits comprises ten binary digits.

6. The power digital to analog converter of claim 1, further comprising:
    a power digital to analog converter power amplifier controller module coupled with the course-resolution digital to analog converter and the fine-resolution digital to analog converter for supplying the first segment of binary digits and the second segment of binary digits.

7. The power digital to analog converter of claim 6, wherein the power digital to analog converter power amplifier controller module is coupled with the course-resolution digital to analog converter and the fine-resolution digital to analog converter via a plurality of optical links.

8. A method for converting multiple digital signals to an amplified analog output signal, comprising:
- connecting a course-resolution digital to analog converter in series with a fine-resolution digital to analog converter;
- converting a first segment of binary digits into a first analog output having a first voltage utilizing the course-resolution digital to analog converter;
- converting a second segment of binary digits into a second analog output having a second voltage utilizing the fine-resolution digital to analog converter; and
- summing the first voltage and the second voltage together to produce an analog output signal representing the binary digits.

9. The method of claim 8, wherein the course-resolution digital to analog converter comprises a switched-capacitor digital to analog converter.

10. The method of claim 8, wherein the fine-resolution digital to analog converter comprises a linear amplifier.

11. The method of claim 8, wherein the first segment of binary digits comprises five binary digits.

12. The method of claim 8, wherein the second segment of binary digits comprises ten binary digits.

13. The method of claim 8, further comprising:
- coupling a power digital to analog converter power amplifier controller module with the course-resolution digital to analog converter and the fine-resolution digital to analog converter for supplying the first segment of binary digits and the second segment of binary digits.

14. The method of claim 13, wherein the power digital to analog converter power amplifier controller module is coupled with the course-resolution digital to analog converter and the fine-resolution digital to analog converter via a plurality of optical links.

15. A system for converting multiple digital signals to an amplified analog output signal, comprising:
- a step generator for converting a first segment of binary digits into a first analog output having a first voltage;
- an interpolator for converting a second segment of binary digits into a second analog output having a second voltage, where the first voltage and the second voltage are added together to produce an analog output signal representing the binary digits;
- a controller module coupled with the step generator and the interpolator for supplying the first segment of binary digits and the second segment of binary digits; and
- a load connected to the step generator and the interpolator for receiving the analog output signal.

16. The system of claim 15, wherein the step generator comprises a switched-capacitor digital to analog converter.

17. The system of claim 15, wherein the interpolator comprises a linear amplifier.

18. The system of claim 15, wherein the first segment of binary digits comprises five binary digits.

19. The system of claim 15, wherein the second segment of binary digits comprises ten binary digits.

20. The system of claim 19, wherein the controller module is coupled with the step generator and the interpolator via a plurality of optical links.

* * * * *